United States Patent [19]

Uehara et al.

[11] Patent Number: 4,654,965

[45] Date of Patent: Apr. 7, 1987

[54] METHOD OF MANUFACTURING LIQUID CRYSTAL DISPLAY UNIT

[75] Inventors: Kiyohiro Uehara, Yokohama; Shigeyuki Sakai, Nakatsugawa, both of Japan

[73] Assignee: Ricoh Company, Ltd., Tokyo, Japan

[21] Appl. No.: 755,430

[22] Filed: Jul. 16, 1985

[30] Foreign Application Priority Data

Jul. 16, 1984 [JP] Japan .............................. 59-107283[U]
Sep. 19, 1984 [JP] Japan .............................. 59-195931[U]

[51] Int. Cl.⁴ .......................... H05K 3/36; H05K 7/02
[52] U.S. Cl. ................................... 29/830; 361/400; 361/412; 350/334; 350/343
[58] Field of Search ............ 29/830; 315/169.3, 169.4; 361/412, 413, 400, 395; 350/344

[56] References Cited

U.S. PATENT DOCUMENTS

| | | | |
|---|---|---|---|
| 3,871,746 | 3/1975 | Muto et al. | 350/343 |
| 4,012,117 | 3/1977 | Lazzery | 361/395 X |
| 4,260,224 | 4/1981 | Takayama | 350/334 X |
| 4,392,720 | 7/1983 | Ganguillet et al. | 350/343 X |
| 4,469,410 | 9/1984 | Ikesue | 350/343 |
| 4,500,171 | 2/1985 | Penz et al. | 350/343 X |
| 4,514,042 | 4/1985 | Nukii et al. | 350/334 X |
| 4,527,862 | 7/1985 | Arakawa | 350/334 |

FOREIGN PATENT DOCUMENTS 56-122011 9/1981 Japan .................................. 350/343
58-18993 2/1983 Japan .
58-105280 6/1983 Japan .

OTHER PUBLICATIONS

IBM Tech. Disclosure Bulletin, vol. 15, No. 2, Jul. 1972, pp. 580–581.

Primary Examiner—Howard N. Goldberg
Assistant Examiner—Carl J. Arbes
Attorney, Agent, or Firm—Oblon, Fisher, Spivak, McClelland & Maier

[57] ABSTRACT

A panel board on which a liquid crystal display device and a printed-circuit board on which an electric circuit for driving the liquid crystal display device are electrically and mechanically connected to each other by an electrically conductive heat-sealing connector. When joining the panel board and the printed-circuit board, the heat-sealing connector is heated by a heating head applied against the panel board or infrared radiation applied through the panel board.

41 Claims, 4 Drawing Figures

METHOD OF MANUFACTURING LIQUID CRYSTAL DISPLAY UNIT

BACKGROUND OF THE INVENTION

The present invention relates to a method of manufacturing a liquid crystal display unit. Specifically, it relates to a method for connecting a first circuit board on which a driver IC is mounted to a second board on which an LCD is mounted.

There have heretofore been known liquid crystal display units comprising a printed-circuit board with a driver IC mounted thereon and a second board on which the signal wires of a liquid crystal display device are mounted. The printed-circuit board is connected to the signal wires of the second board by a hot-melt connector with an electrically conductive material mixed therein. More specifically, the printed-circuit board and the second board supporting the liquid crystal display device (hereinafter referred to as the "panel board") are electrically connected to each other by positioning the hot-melt connector between the printed-circuit board and the panel board, and then heating the hot-melt connector through the printed-circuit board to melt the hot-melt connector. However, heating the hot-melt connector through the printed-circuit board has been disadvantageous in that various conditions such as the time and temperature at which the hot-melt connector is heated vary depending on the thickness, thermal conductivity, and other properties of the printed-circuit board, and that the wiring pattern on the printed-circuit board is generally made of a material which is a good heat conductor that will cause an undesirable temperature rise in surrounding parts. To avoid these shortcomings, it has been practiced to connect the printed-circuit board and the panel board with a bridge-like conductive connector through the hot-melt connector. With this method, however, the bridge connector adds to the cost of the liquid crystal display unit, and the efficiency of assembling the parts together is low since two connections have to be made, one to the printed-circuit board and another to the panel board. Another problem with this method is that the liquid crystal display unit is large in size because the components are connected in a planar configuration.

As disclosed in Japanese Laid-Open Patent Publication No. 58-105280, it is known to employ a heat-sealing connector in a dot-matrix liquid crystal display unit for reliably and easily connecting a liquid crystal display panel board having filamentary electrodes and a printed-circuit board. The heat-sealing connector comprises, for example, an insulating board and a hot-melt electrically conductive adhesive layer disposed on the insulating board. The heat-sealing connector is thermally fused and joined to the panel board at a high tempeature. However, inasmuch as the panel board has a limited heat-resistant capability, there is a limitation on the temperature to which the heat-sealing connector can be heated by a heating head, and the panel board tends to be deformed by the heat applied by the heating head, with the result that transparent electrodes on the panel board may be broken. Where the panel board is in the form of a glass sheet, it is necessary to provide a separate film-like connector as the heating time is increased due to the thickness of the glass sheet.

SUMMARY OF THE INVENTION

It is an object of the present invention to provide a method of manufacturing a liquid crystal display unit from a reduced number of parts which is efficient and highly reliable.

Another object of the present invention is to provide a method of manufacturing a liquid crystal display unit while preventing wires on a panel board from being broken due to deformation thereof with heat applied through the panel board upon the heat sealing and also preventing the heating from continuing for a long time due to the thickness of the panel board.

According to the present invention, hot-melt connectors are interposed between a printed-circuit board and a panel board on which a liquid crystal display device is mounted, and the hot-melt connectors are melted by being heated through the panel board. Therefore, the printed-circuit board and the panel board can easily be electrically and mechanically connected to each other without requiring an additional connector therebetween. The printed-circuit board and the panel board may be joined by an infrared-absorbing electrically conductive heat-sealing connector which can be fused by being exposed to infrared radiation. Accordingly, there can be manufactured a liquid crystal display unit which is highly reliable, small in size, and low in profile, from a reduced number of parts with an increased degrees of efficiency. Heating conditions are not required to be changed even when the printed-circuit board is made of a different material. The printed-circuit board and the panel board can be joined simultaneously at a plurality of points by aligning the heating portions of a heating head with the areas to be joined.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENT

Figure 1:
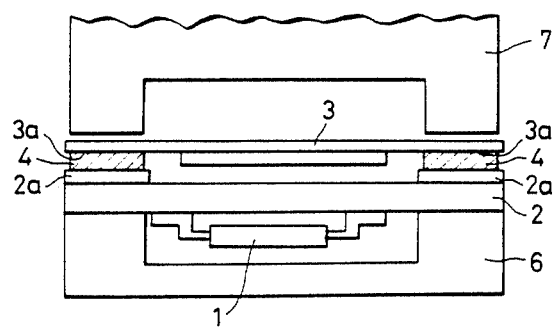
FIG. 1 is a side elevational view illustrative of a method of joining the components of a liquid crystal display unit according to an embodiment of the present invention.

A method of manufacturing a liquid crystal display unit according to the present invention will be described with reference to FIG. 1. A printed-circuit board 2 supporting a driver IC 1 on the face thereof is placed on an assembling jig 6 with the driver IC 1 facing downwardly, and hot-melt connectors 4 are disposed on wiring members 2a exposed on the back of the printed-circuit board 2 at opposite side portions thereof. Thereafter, the signal wire portions 3a of a panel board 3 on which a liquid crystal display device is supported are positioned on the hot-melt connectors 4, respectively. A heating head 7 having heating portions on opposite sides thereof is then pressed against the panel board 3 for melting the holt-melt connectors 4 to join the printed-circuit board 2 and the panel board 3.

The printed-circuit board 2 is preferably made of glass, epoxy resin, polyimide, polyester, paper, phenolic resin, triazine rein, ceramics, or the like. The panel board 3 is heat conductive and is preferably in the form of a sheet film made of polyethylene terephthalate, polybutylene terephthalate, polyether sulfone, polycarbonate resin, polysulfone, polyimide, acetate, polyester, or the like.

According to another embodiment of the present invention, there is employed a heat-sealing connector having infrared-absorbing electrically conductive heat-sealing layer composed of an infrared-absorbing electrically conductive material and a hot-melt adhesive, or an electrically conductive material, an electrically nonconductive infrared absorbent, and a hot-melt adhesive. When joining the heat-sealing connector to a panel board on which a liquid crystal display device is mounted, the heat-sealing connector is exposed to light containing infrared radiation which can be absorbed by the heat-sealing connector, to thermally fuse the heat-sealing layer for connecting the heat-sealing connector to the panel board. The panel board allows infrared radiation to pass through it. With this embodiment, the heat-sealing connector can be joined to the panel board without causing the panel board to be thermally deformed.

Figure 2:
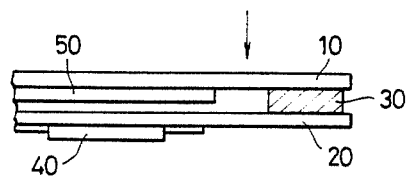
FIG. 2 is a fragmentary side elevational view explanating a method of joining boards with a heat-sealing connector.

FIG. 2 shows the manner in which a printed-circuit board and a panel board on which a liquid crystal display device is mounted are connected to each other by a heat-sealing connector according to the above embodiment. A panel board 10 supporting a liquid crystal display device 50 is made of a plastics material such as polyester for example. A printed-circuit board 20 supporting a driver IC 40 thereon is made of glass or a plastics material such as epoxy resin for example. A heat-sealing connector 30 is interposed between the panel board 10 and the printed-circuit board 20. For connecting the panel board 10 and the printed-circuit board 20, light containing infrared radiation is radiated onto the assembly in the direction of the arrow to expose the heat-sealing connector 30 to the light through the panel board 10. Since the heat-sealing connector 30 has the infrared-absorbing electrically conductive heat-sealing layer, only the heat-sealing connector 30 is selectively thermally fused to join the panel board 10 and the printed-circuit board 20.

The electrically conductive material in the heat-sealing connector 30 preferably comprises an organic conductor such as graphite, electrically conductive carbon black or the like having a sufficient infrared-absorbing ability, or metal particles of copper, aluminum, nickel, cobalt, silver or the like, or any other electrically conductive fine particles. Where the electrically conductive material has no sufficient infrared-absorbing ability, an ordinary infrared absorbent may be added thereto. Such an infrared absorbent may comprise any electrically conductive fine particles capable of absorbing infrared radiation. For example, carbon black, various organic black pigments, titanium dioxide, silicon dioxide can be used as the material of the infrared absorbent. The hot-melt adhesive in the heat-sealing connector 30 is fused for adhesive bonding upon being heated, and may comprise a variety thermoplastic resins used as a base. The hot-melt adhesive employed according to the present invention is fused in a temperature range from 100° to 180° C., preferably from 110° to 130° C. The electrically conductive heat-sealing layer used in the present invention is composed of 1 part by weight of the hot-melt adhesive, 10 through 30 parts, preferably 15 through 25 parts, by weight of the electrically conductive material, and 5 through 20 parts, preferably 8 through 16 parts, by weight of the infrared absorbent, if used.

Figure 3:
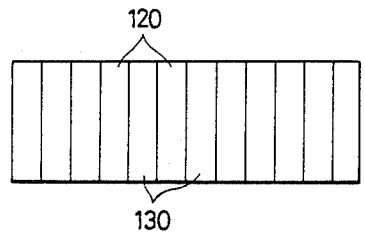
FIG. 3(a) is a plan view of a heat-sealing connector.
FIG. 3(b) is a side elevational view of the heat-sealing connector shown in FIG. 3(a).
Figure 3:
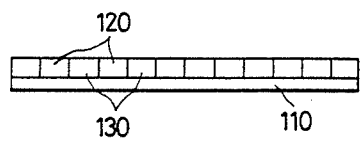

The heat-sealing connector 30 can be formed to various shapes and structures. An infrared-absorbing electrically conductive heat-sealing layer may be formed in advance on a panel board and/or a printed-circuit board for use as the heat-sealing connector 30. Alternatively, as shown in FIGS. 3(a) and 3(b), electrically conductive heat-sealing layers 120 are disposed in spaced-apart relation on an insulating substrate 110, and insualting paint layers 130 are disposed on the insulating board 110 between the heat-sealing layers 120. Each of the electrically conductive heat-sealing layers 120 contains an infrared-absorbing electrically conductive material or an electrically conductive material and a nonconductive infrared absorbent. Each of the insulating paint layers 13 contains a nonconductive infrared absorbent.

The insulating substrate 110 may be in the form of a plastic film of polyester, polyamide, polyvinyl chloride, polycarbonate, polysulfone, polyether sulfone, or the like.

The heat-sealing connector may comprise an infrared-absorbing electrically conductive heat-sealing layer disposed fully over a surface of the insulating substrate, or infrared-absorbing electrically conductive heat-sealing layers and nonconductive heat-sealing layers which are alternately disposed on a surface of a block in the form of a rectangular parallelepiped.

For preparing the heat-sealing connector, an electrically conductive material, a hot-melt adhesive, and, if necessary, a coating agent containing an infrared absorbent are coated on a substrate by screen process printing and then dried.

In the foregoing method, the heat-sealing connector can be joined to the printed-circuit board and filamentary transparent electrodes on the panel board by rapidly heating the heat-sealing layer in the heat-sealing connector. More specifically, since the electrically conductive and/or nonconductive heat-sealing layer contains the infrared absorbent, the heat-sealing layer can be heated to high temperature in a shorter period of time than the other portions. Therefore, the time in which the heat-sealing layer can be thermally fused is greatly shortened. Since the panel board is not heated excessively, it is not deformed, and the transparent electrodes thereon are not broken.

An example will be described below.

20 weight % of metal particles of silver each having a diameter of 10 micrometers or less was uniformly dispersed in a polyester-based hot-melt adhesive (manufactured by Fuji Photo Film Co., Ltd. under the trademark "STAFIX"). In the dispersion was mixed 10 weight % of a black dye (NK2772 manufactured by Nippon Kankohshikiso K.K.) as an infrared absorbent. The resultant dispersion was coated on an insulating substrate in the form of a plastic film of fluorine having a thickness of 10 micrometers by screen process printing, and then dried to form a heat-sealing connector. The heat-sealing connector comprised a plurality of heat-sealing layers spaced at intervals of 50 micrometers and each having a width of 20 micrometers and a thickness of 25 micrometers.

The heat-sealing connector was placed on the filamentary electrodes on a liquid crystal display panel in the form of a polyester sheet, and exposed to a laser beam to fuse the heat-sealing layers for enabling the filamentary electrodes to the heat-sealing layers of the heat-sealing connector. The heat-sealing layers were themally fused in a short period of time which was about one fifth of the time which would be required if no infrared absorbent was added. During the thermal fusion, the liquid crystal display panel was not heated and not thermally deformed.

Although certain preferred embodiments have been shown and described, it should be understood that many changes and modifications may be made therein without departing from the scope of the appended claims.

What is claimed is:

1. An electrical connection circuit for connecting signal wires of a display device to connection points on a printed-circuit board comprising:
   a heat-sealing connector disposed on the printed-circuit board and contacting said connection points; and
   an energy-transparent panel board made of a resin sheet on which the display device is mounted, said panel board being disposed on the heat-sealing connector so that an electrically conductive path is formed between the connection points of said printed circuit board and said signal wires of the display device; wherein the heat-sealing connector is heated by energy passed through said energy-transparent panel board.

2. An electrical connection circuit according to claim 1 wherein said panel board is transparent to infrared radiation and said heat-sealing connector absorbs infrared radiation.

3. An electrical connection circuit according to claim 1 wherein said panel board is transparent to directly applied heat and said heat-sealing connector absorbs heat passed through the panel board.

4. A method of connecting a printed circuit board to a panel board on which a liquid crystal display device is mounted, comprising the steps of:
   (a) forming said panel board as a sheet made of synthetic resin;
   (b) sandwiching an electrically conductive heat-sealing connector between said printed-circuit board and said panel board; and
   (c) applying heat to said heat-sealing connector through said resin sheet of said panel board to cause said heat-sealing connector to be thermally fused for joining said printed circuit board and said panel board and wires thereon.

5. A method according to claim 1, wherein the heat is applied by a heating head.

6. A method according to claim 1, wherein said connector comprises a hot-melt adhesive and an electrically conductive material mixed therein.

7. A method according to claim 1, wherein said heat-sealing connector is in the form of a sheet.

8. A method according to claim 1, wherein said heat-sealing connector is in the form of a block.

9. A method according to claim 1, wherein an integrated circuit for driving the liquid crystal display device is mounted on said printed-circuit board.

10. A method according to claim 1, wherein said printed-circuit board is made of a material selected from the group consisting of glass, epoxy resin, polyimide, polyester, paper, phenolic resin, triazine resin, and ceramics.

11. A method according to claim 1, wherein said panel board comprises a sheet film of synthetic resin.

12. A method according to claim 11, wherein said panel board is made of a material selected from the group consisting of polyethylene terephthalate, polybutylene terephthalate, polyether sulfone, polycarbonate resin, polysulfone, polyimide, acetate, and polyester.

13. A method according to claim 1, wherein said heat-sealing connector comprises an electrically conductive heat-sealing layer composed of an infrared-absorbing electrically conductive material and a hot-melt adhesive.

14. A method according to claim 1, wherein said heat-sealing connector comprises an electrically conductive heat-sealing layer composed of an electrically conductive material, an electrically nonconductive infrared absorbent, and a hot-melt adhesive.

15. A method according to claim 13 or 14, wherein said electrically conductive material is in the form of electrically conductive fine particles.

16. A method according to claim 13 or 14, wherein said electrically conductive material comprises an organic conductor.

17. A method according to claim 16, wherein said organic conductor is made of a material selected from the group consisting of graphite or electrically conductive carbon black having a sufficient infrared-absorbing ability.

18. A method according to claim 13 or 14, wherein said electrically conductive material is in the form of metal particles.

19. A method according to claim 18, wherein said metal particles are made of a material selected from the group consisting of copper, aluminum, nickel, cobalt, and silver.

20. A method according to claim 13, wherein said heat-sealing connector further comprises an infrared absorbent.

21. A method according to claim 20, wherein said infrared absorbent is in the form of electrically conductive fine particles capable of absorbing infrared radiation.

22. A method according to claim 21, wherein said particles are made of a material selected from carbon black, an organic black pigment, titanium dioxide, and silicon dioxide.

23. A method according to claim 13, or 14, wherein said hot-melt adhesive basically comprises a thermoplastic resin capable of being fused in a temperature range from 100° to 180° C.

24. A method according claim 14, wherein said electrically conductive heat-sealing layer comprises 1 part by weight of said hot-melt adhesive, 10 through 30 parts by weight of said electrically conductive material, and 5 through 20 parts by weight of said infrared absorbent.

25. A method according to claim 13 or 14, wherein said electrically conductive infrared-absorbing layer is formed in advance on said panel board and/or said printed-circuit board.

26. A method according to claim 4, wherein said heat-sealing connector comprises an insulating substrate, a plurality of spaced electrically conductive heat-sealing layers disposed on said insulating substrate, and a plurality of insulating paint layers disposed on said insulating substrate between said electrically conductive heat-sealing layers.

27. A method according to claim 26, wherein each of said electrically conductive heat-sealing layers contains an infrared-absorbing electrically conductive material.

28. A method according to claim 26, wherein each of said electrically conductive heat-sealing layers contains an electrically conductive material and a nonconductive infrared absorbent.

29. A method according to claim 26, wherein each of said insulating paint layers contains a nonconductive infrared absorbent.

30. A method according to claim 26, wherein said insulating substrate comprises a film of synthetic resin.

31. A method according to claim 30, wherein said film is made of a material selected from the group consisting of polyester, polyamide, polyvinyl chloride, polycarbonate, polysulfone, and polyether sulfone.

32. A method according to claim 4, wherein said heat-sealing connector comprises an insulating substrate and an infrared-absorbing electrically conductive heat-sealing layer disposed fully over said insulating substrate.

33. A method according to claim 4, wherein said heat-sealing connector comprises a block in the form of a rectangular parallelepiped, infrared-absorbing electrically conductive heat-sealing layers, and nonconductive heat-sealing layers which are alternately disposed on a surface of said block.

34. A method according to claim 4, wherein said heat-sealing connector is prepared by coating an electrically conductive material and a hot-melt adhesive on an insulating substrate, and drying the coated electrically conductive material and hot-melt adhesive.

35. A method according to claim 34, wherein a coating agent containing an infrared absorbent is additionally coated and dried on said insulating substrate.

36. A method according to claim 34 or 35, wherein said electrically conductive material, said hot-melt adhesive, and said coating agent are coated by screen process printing.

37. A method of connecting a printed-circuit board on which a driver IC is disposed centrally to a panel board on which a liquid crystal display device is mounted, comprising the steps of:
(a) placing said printed-circuit board at opposite ends thereof on an assembling jig with said driver IC facing downwardly;
(b) positioning a connector on wiring members exposed on the back of said printed-circuit board opposite to said opposite ends;
(c) thereafter placing signal wire portions of said panel on said connector;
(d) holding a heating head against said panel board; and
(e) applying heat from said heating head to said connector through said panel board.

38. A method of connecting a printed circuit board to a panel board on which a liquid crystal display device is mounted, comprising the steps of:
(a) sandwiching an electrically conductive heat-sealing connector between said printed-circuit board and said panel board; and
(b) applying heat to said heat-sealing connector through said panel board to cause said heat-sealing connector to be thermally fused for joining said printed circuit board and said panel board and wires thereon,
wherein said heat-sealing connector comprises an electrically conductive heat-sealing layer composed of an infrared-absorbing electrically conductive material and a hot-melt adhesive, and wherein said heat sealing connector is heated by exposure to infrared radiation produced by a laser beam.

39. A method of connecting a printed circuit board to a panel board on which a liquid crystal display device is mounted, comprising the steps of:
(a) sandwiching an electrically conductive heat-sealing connector between said printed-circuit board and said panel board; and
(b) applying heat to said heat-sealing connector through said panel board to cause said heat-sealing connector to be thermally fused for joining said printed circuit board and said panel board and wires thereon,
wherein said heat-sealing connector comprises an electrically conductive heat-sealing layer composed of an electrically conductive material, an electrically nonconductive infrared absorbent and a hot-melt adhesive, and wherein said heat sealing connector is heated by exposure to infrared radiation produced by a laser beam.

40. A method of connecting a printed circuit board to a panel board on which a liquid crystal display device is mounted, comprising the steps of:
(a) sandwiching an electrically conductive heat-sealing connector between said printed-circuit board and said panel board; and
(b) applying heat to said heat-sealing connector through said panel board to cause said heat-sealing connector to be thermally fused for joining said printed circuit board and said panel board and wires thereon,
wherein said heat-sealing connector is prepared by coating an electrically conductive material and a hot-melt adhesive on an insulating substrate, and drying the coated electrically conductive material and hot-melt adhesive, and additionally coating and drying a coating agent containing an infrared absorbent on said insulating substrate, and
wherein said hot-melt adhesive is made of a polyester-based material, said heat-sealing connector being prepared by uniformly dispersing 20% by weight of metal particles as the electrically conductive material in said hot-melt adhesive to produce a dispersion, uniformly mixing 10% by weight of a black dye as the infrared absorbent into said dispersion, and coating the resultant dispersion on said insulating substrate as a plurality of spaced heat-sealing layers.

41. A method according to claim 40, wherein each of said heat-sealing layers has a width of 20 micrometers and a thickness of 25 micrometers.

* * * * *